US011162980B2

(12) United States Patent
Brecht

(10) Patent No.: US 11,162,980 B2
(45) Date of Patent: Nov. 2, 2021

(54) COAXIAL VIA ARRANGEMENT IN PROBE CARD FOR AUTOMATED TEST EQUIPMENT

(71) Applicant: Teradyne, Inc., North Reading, MA (US)

(72) Inventor: Brian Brecht, Newbury Park, CA (US)

(73) Assignee: Teradyne, Inc., North Reading, MA (US)

( * ) Notice: Subject to any disclaimer, the term of this patent is extended or adjusted under 35 U.S.C. 154(b) by 64 days.

(21) Appl. No.: 16/726,665

(22) Filed: Dec. 24, 2019

(65) Prior Publication Data

US 2021/0190825 A1 Jun. 24, 2021

(51) Int. Cl.
*G01R 31/28* (2006.01)
*G01R 1/073* (2006.01)
*G01R 31/319* (2006.01)

(52) U.S. Cl.
CPC ..... *G01R 1/07314* (2013.01); *G01R 31/2834* (2013.01); *G01R 31/31905* (2013.01)

(58) Field of Classification Search
CPC .............. G01R 1/0416; G01R 1/06727; G01R 31/2868; G01R 31/2893; G01R 31/2896
See application file for complete search history.

(56) References Cited

U.S. PATENT DOCUMENTS

| 5,210,485 A | 5/1993 | Kreiger et al. |
| 7,332,921 B2 | 2/2008 | Nulty et al. |
| 2006/0250150 A1* | 11/2006 | Tunaboylu ......... G01R 1/07378 324/756.03 |
| 2007/0145989 A1* | 6/2007 | Zhu ..................... G01R 1/06772 324/754.07 |
| 2009/0091343 A1 | 4/2009 | Wu et al. |
| 2009/0176406 A1 | 7/2009 | Yaghmai et al. |
| 2010/0164521 A1 | 7/2010 | Chen et al. |
| 2010/0255690 A1 | 10/2010 | Waite et al. |
| 2013/0027071 A1 | 1/2013 | Canegallo et al. |
| 2013/0033283 A1* | 2/2013 | Wu ..................... G01R 1/07378 324/756.03 |
| 2018/0024167 A1* | 1/2018 | Maggioni .......... G01R 1/07378 324/750.24 |

FOREIGN PATENT DOCUMENTS

| CN | 104508499 A | 4/2015 |
| CN | 104582236 A | 4/2015 |

(Continued)

OTHER PUBLICATIONS

U.S. Appl. No. 16/726,640, filed Dec. 24, 2019, Brecht et al.

(Continued)

*Primary Examiner* — Tung X Nguyen
(74) *Attorney, Agent, or Firm* — Wolf, Greenfield & Sacks, P.C.

(57) ABSTRACT

A probe card in an automated test equipment (ATE) is disclosed. The probe card may be a portion of a vertical-type probe card assembly in which pads on a circuit board are contacted by probe pins, with vertical vias in the circuit board interconnecting various conductive elements. Disclosed herein is a probe card having ground vias in a coaxial arrangement around a signal via that provide electromagnetic shielding to a signal via to reduce crosstalk between adjacent signal vias.

15 Claims, 10 Drawing Sheets

(56) References Cited

FOREIGN PATENT DOCUMENTS

| | | | |
|---|---|---|---|
| CN | 205787004 | U | 12/2016 |
| CN | 107367678 | A | 11/2017 |
| JP | H11-30632 | A | 2/1999 |
| JP | 2011-222928 | A | 11/2011 |
| JP | 2012-015469 | A | 1/2012 |
| JP | 2012-132685 | A | 7/2012 |
| JP | 2012-132823 | A | 7/2012 |
| JP | 2019-071420 | A | 5/2019 |
| KR | 10-2012-0076265 | A | 7/2012 |

OTHER PUBLICATIONS

U.S. Appl. No. 16/726,649, filed Dec. 24, 2019, Brecht.
U.S. Appl. No. 16/726,657, filed Dec. 24, 2019, Brecht.
Brecht et al., Probe Card Pad Geometry in Automated Test Equipment, U.S. Appl. No. 16/726,640, filed Dec. 24, 2019.
Brecht, Probe Card Assembly in Automated Test Equipment, U.S. Appl. No. 16/726,649, filed Dec. 24, 2019.
Brecht, Transposed Via Arrangement in Probe Card for Automated Test Equipment, U.S. Appl. No. 16/726,657, filed Dec. 24, 2019.
Lee, Shape Optimization of Vertical-type Probe Needle Integrated with Floating Mount Technology. Thesis presented to University of Waterloo, Ontario, Canada. 2013. 60 pages.
International Search Report and Written Opinion dated Apr. 8, 2021 in connection with International Application No. PCT/US2020/064147.
International Search Report and Written Opinion dated Apr. 8, 2021 in connection with International Application No. PCT/US2020/064148.
International Search Report and Written Opinion dated Apr. 8, 2021 in connection with International Application No. PCT/US2020/064167.
International Search Report and Written Opinion dated Apr. 8, 2021 in connection with International Application No. PCT/US2020/064170.

* cited by examiner

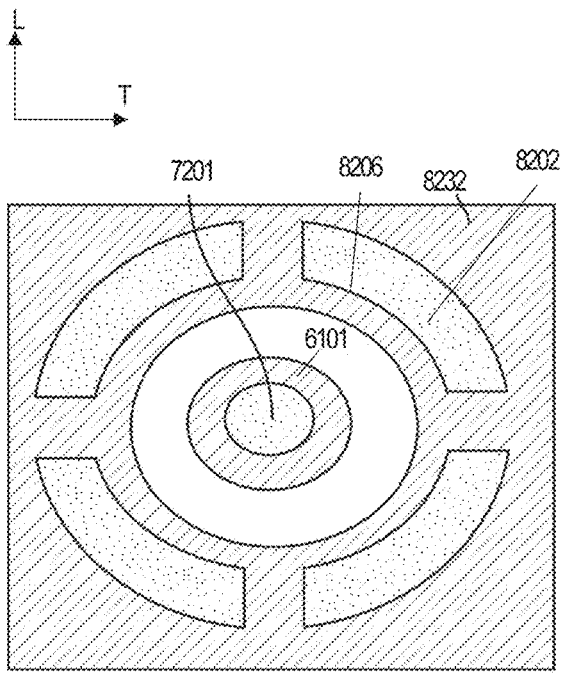 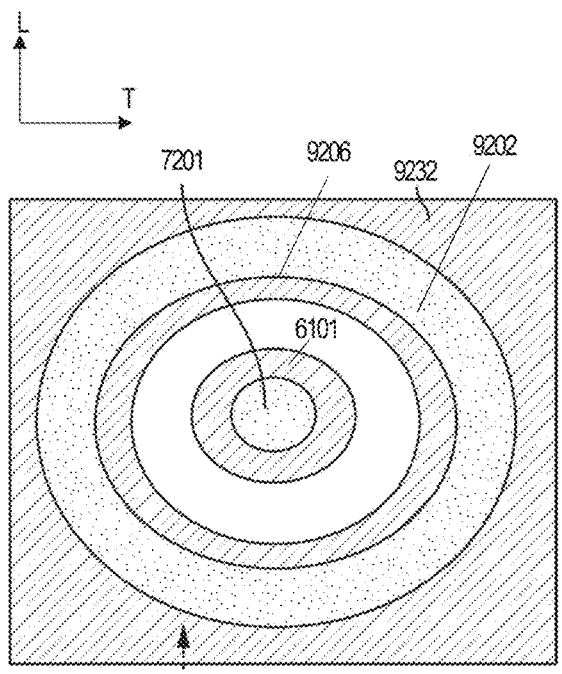 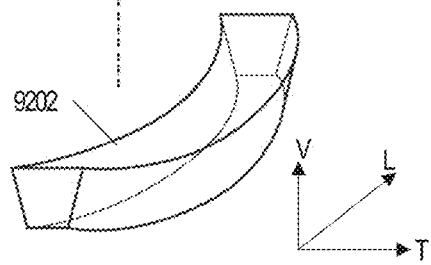
FIG. 8A
FIG. 8B
FIG. 8C

COAXIAL VIA ARRANGEMENT IN PROBE CARD FOR AUTOMATED TEST EQUIPMENT

BACKGROUND

Electronic components, such as semiconductor devices, circuits, and printed circuit board (PCB) assemblies, are frequently tested, during and after their manufacture, using a test system such as an automated test equipment (ATE). To perform these tests, an ATE may include instruments that generate or measure test signals such that a range of operating conditions can be tested on a particular device-under-test (DUT). An instrument, for example, may generate a pattern of digital or analog signals that are applied to a semiconductor device, and may measure digital or analog signals from the semiconductor device as a response.

In some instances, semiconductor devices are tested at the wafer level. Testing at the wafer-level has several benefits including testing and validating a device as a known good die before it is diced as a semiconductor die and packaged. A wafer may contain many devices, and permit testing of a large number of devices in close proximity to each other without having to reload another wafer, which can decrease testing time and increase manufacturing throughput.

Each device under test contains exposed connection structures such as pads or bumps, which may serve as test points at which test signals may be applied to or measured to a DUT on a wafer. An ATE interfaces with the device using a probe card assembly that contains an array of multiple probe pins. Each probe pin has a tiny probe needle on a free end that is used to make electrical contact to a test point of the DUT, with the opposite end of the probe pin electrically connected to pads on a printed circuit board, which may be part of the tester or may be part of the probe card assembly that, in turn, is electrically connected to the tester. Sometimes a probe card assembly includes more than one circuit boards stacked vertically over each other to form a probe card. Mechanical supports within the probe card assembly hold the probe pins and press the pins against the printed circuit board in the probe card, enabling contact to be made between the board and the pins. In order to make electrical contact to the wafer, a wafer prober presses the wafer against the probe needles so that the needle tips make physical and electrical contact with test points on the device. Once the probe needles have made contact with both the test points on the wafer and the pads that are electrically coupled to the tester, the testing process can begin. A probe card assembly may also be referred to as a probe card, when various components of the probe card assembly has been assembled together.

SUMMARY

According to some embodiments, a probe card for testing a semiconductor wafer is provided. The probe card comprises a board having a first pad and a second pad disposed adjacent each other along a first direction parallel to a first surface of the board configured to face the semiconductor wafer; a first via and a second via in the board, the first via having a first contact surface in direct contact with the first pad, the second via having a second contact surface in direct contact with the second pad. A center of the first contact surface and a center of the second contact surface are offset towards each other along the first direction from respective centers of the first and second pads.

According to some embodiments, a probe card for testing a semiconductor wafer is provided. The probe card comprises a board. The board comprises a first surface, a second surface separated from the first surface in a first direction, and an interior between the first surface and the second surface. The board further comprises plurality of pads on the first surface configured to be connected with a plurality of wafer pads on the semiconductor wafer via a plurality of probe pins contacting the plurality of pads; at least one layer of conductors in the interior; and a first via in the board, elongated in the first direction and in contact with a first pad of the plurality of pads; a second via in the board, elongated in the first direction, and at least partially surrounding the first via. The second via comprises a perimeter facing the first via.

The foregoing is a non-limiting summary of the invention, which is defined by the appended claims.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

FIGS. 8A and 8B are top view diagrams that show two variations of the embodiment shown in FIG. 7C;

FIG. 8C is an isometric view of a section of ground via 9202, according to an embodiment.

DETAILED DESCRIPTION

Figure 1:
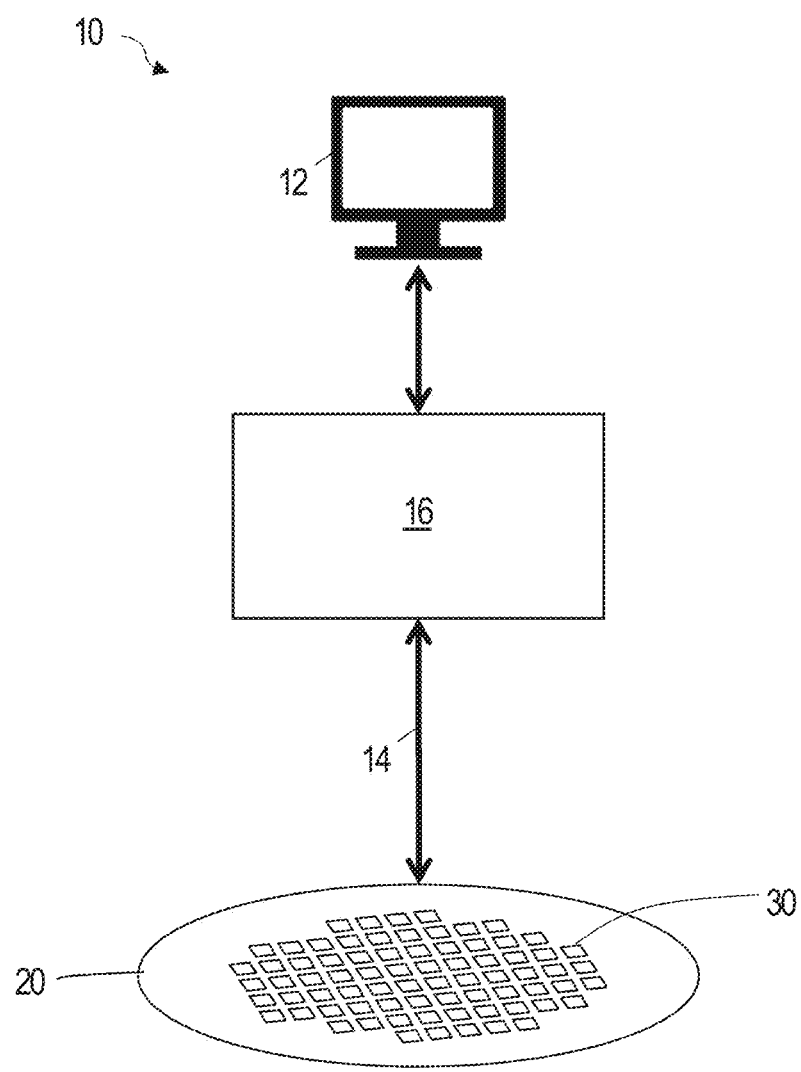
FIG. 1 is a high-level schematic diagram of an exemplary test system according to aspects of the present application.

In probe card assemblies, an array of probe pins are each arranged perpendicularly, or "vertically" from a wafer surface, with free ends of the probe pins used to contact wafer pads the wafer. The wafer pads serve as test points during testing of a DUT on the wafer. Probe pins are arranged generally with the same pitch as wafer pads on the DUT such that a probe needle at the free end of each probe pin will land on a corresponding wafer pad during testing. The opposite ends of the probe pins are each in contact with a corresponding probe card pad on a surface of a circuit board that is part of a probe card within the probe card assembly. The probe card pads and probe pins serve to electrically interface test points on the DUT with circuitry in the rest of the tester via the circuit board in the probe card. The circuit board may have vias that route electric signals vertically through different planes within the circuit board, and conductive structures such as traces within each plane that route electric signals horizontally parallel to the plane.

Aspects of the present application are directed to a novel transposed via arrangement within a circuit board for a probe card. In some embodiments, adjacent vias are offset towards each other such that the inductance between the adjacent vias may be reduced to provide a desirable impedance during high frequency signal transmission. The inventor has recognized that inductance between adjacent conductive structures such as vias increase with the spacing between such conductive structures. When high frequency data signal and power signal are transmitted in the vias, the inter-via inductance may increase an impedance of the signal path through the vias. When the impedances are much higher than impedances of components on the DUT, which is typically 50Ω single ended and/or 100Ω differential, a large impedance mismatch is created in the signal path from the vias to and from the components in electrical contact with the probe pins, which causes undesirable signal reflections.

In some embodiments, instead of vias being spaced at a fixed pitch that is the same as corresponding wafer pads on the surface of the DUT, vias may be transposed such that they no longer contact the center of respective probe card pads on a surface of the circuit board in the probe card. In such embodiments, there is no need to shrink the probe card pad pitch and they may have the same pitch as the probe card pins that connects the probe card pads to respective wafer pads. In some embodiments, to provide electrical connection to the close proximity of the transposed vias while avoid shorting, the vias are connected to planes that are in parallel but offset vertically. Conductors in such planes may overlap each other in the vertical direction, but are nevertheless isolated without shorting due to the vertical offset, or "ganging" of the planes.

Some aspects are directed to a probe card having vias that provide electromagnetic shielding to a signal via to reduce crosstalk between adjacent signal vias. In some embodiments, shielding is achieved by at least partially surrounding the signal via with one or more ground vias. The ground via has a perimeter that face the signal via. For the ground via may be shaped as a rectangle, an arc, or a circle from a top view, such that an inner side of the rectangle, arc or circle faces and partially surrounds the signal via to provide electromagnetic shielding of the signal via from other conductive structures within the circuit board.

The aspects and embodiments describes above, as well as additional aspects and embodiments, are described further below with reference to the figures. These aspects and/or embodiments may be used individually, all together, or in any combination of two or more, as the application is not limited in this respect. In the figures, like reference numerals are used to designate like components.

FIG. 1 is a high-level schematic diagram of an exemplary test system according to aspects of the present application.

FIG. 1 illustrates a test system 10 that contains a test computer 12 that controls a tester 16 to perform tests on a device under test (DUT) 30 in accordance to methods disclosed in the present application. In some scenarios, the tester 16 may be an automated test equipment (ATE), constructed using techniques that are known in the art. The DUT 30 may be any suitable device for testing. For example, DUT 30 may be a semiconductor die disposed on a surface of a wafer 20. In some embodiments, DUT 30 may be an un-diced semiconductor die, along with a plurality of similar dies that are also on the wafer 20 for testing with ATE 16. ATE 16 may contain circuitry to generate and/or measure a test signal 14 for DUT 30. ATE 16 may include multiple instruments configured to generate or measure different types of analog or digital signals. Wafer 20 may be held by and moved into contact with ATE 16 via a wafer prober 22. Wafer prober 22 may also provide other functions, such as establishing temperature conditions for testing devices on a wafer.

It should be appreciated that FIG. 1 is a greatly simplified representation of an automated test system. For example, though not illustrated, test system 10 may include control circuitry that controls operation of instruments within ATE 16. Additionally, test system 10 may include processing circuitry to process measurements and determine whether a DUT 30 is operating correctly. A probe card may be provided within ATE 16 to connect test points on the DUT to corresponding test points of instruments within ATE 16. Also, FIG. 1 illustrates a single signal path between ATE 16 and DUT 30. One of skill in the art will appreciate that testing a DUT such as devices on a semiconductor wafer may require hundreds or thousands of test signals to be generated and measured. Accordingly, circuitry as described herein may be duplicated many times within ATE 16 and controlled to provide synchronized test signals for testing DUT 30. Further, though FIG. 1 illustrates a scenario in which a single DUT 30 is being tested, test system 10 may be configured to test multiple devices.

Regardless of the number of instruments or other components generating or measuring test signals and the number of devices under test, test system 10 may include signal delivery components that route the signals between the DUT 30 and the instruments within ATE 16.

Further, it should be appreciated that other components as illustrated are exemplary rather than limiting. For example, although the test computer 12 is illustrated as a personal computer (PC) in FIG. 1, it should be appreciated that any suitable computing device may be used to implement a test computer, for example, a mobile device or a computer work station. Test computer 12 may be connected to a network and capable of accessing resources over the network and/or communicate with one or more other computers connected to the network.

Figure 2:
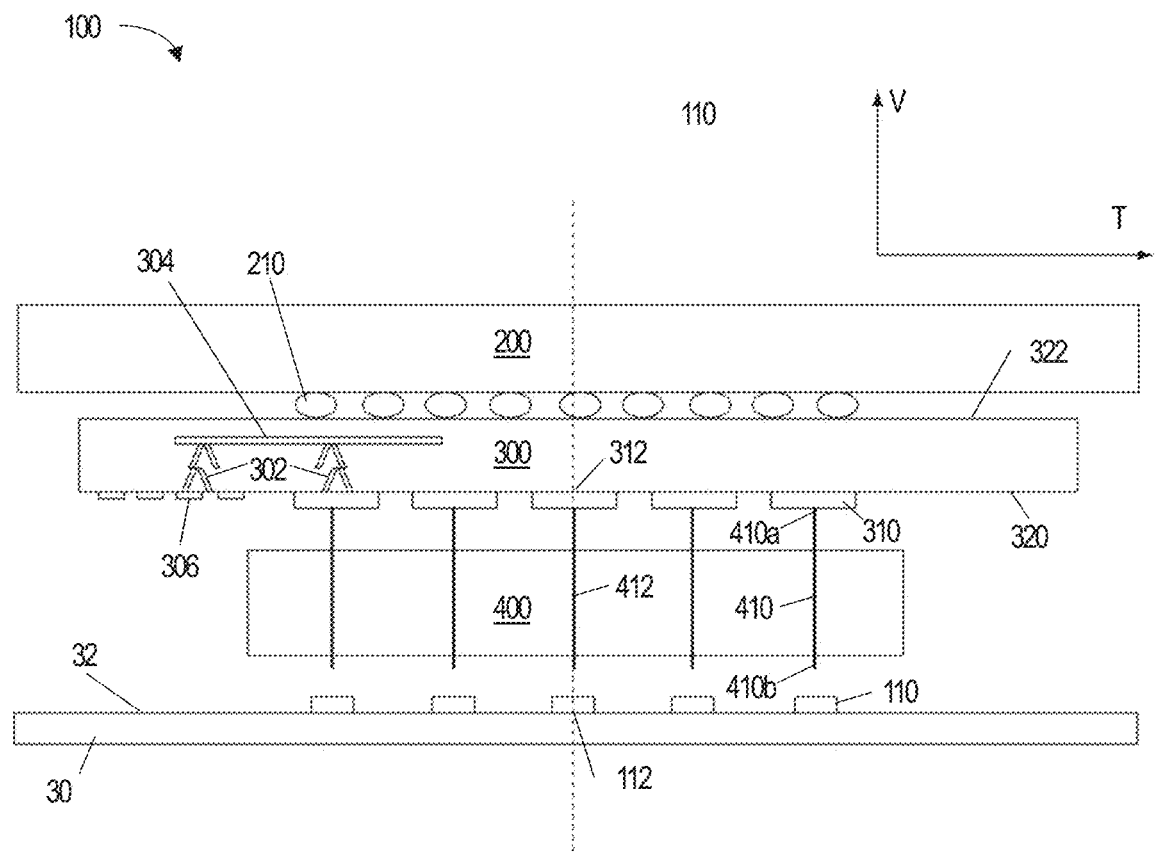
FIG. 2 is a schematic diagram of a probe card assembly 100, in accordance with some embodiments.

FIG. 2 is a schematic diagram of a probe card assembly 100, in accordance with some embodiments. Probe card assembly 100 may be a probe card assembly that is used in ATE 16 as shown in FIG. 1 to interface instruments within the ATE to DUT 30.

As shown in FIG. 2, probe card assembly 100 includes a first circuit board 200, a second circuit board 300, a guide plate 400 with multiple probe pins 410 disposed inside. The first circuit board 200 is stacked vertically over and electrically connected to the second circuit board 300 on a top surface 322, for example via an array of solder bumps 210, although any other suitable connections may be made between the two circuit boards. The two circuit boards 200, 300 may be part of a probe card within the probe card assembly 100. The second circuit board 300 has a top surface 322 opposite the bottom surface 320. Probe card pads 310 are electrically connected to top ends 410a of probe pins 410, where each probe pin 410 has a probe needle at the free end 410b positioned to be in contact with a corresponding wafer pad 110 on the DUT 30. Probe card 100 may be configured to test a specific DUT with a specific arrangement of wafer pads 110, and different probe cards may be used for different DUTs. Probe card 100 may be removably attached to the rest of the ATE 10. Attachment mechanisms are known in the art and are not shown for simplicity.

DUT 30 may be one of an array of DUTs on a wafer 20 as shown in the example in FIG. 1, and one or more of the DUTs may be concurrently tested during manufacturing for quality assurance. A DUT 30 may be a semiconductor die that has an array of wafer pads 110 exposed from an insulative surface 32 that are connected with interconnects and semiconductor components disposed within DUT 30 (not shown) below the insulative surface. While wafer pad 110 is illustrated as a metal pad, it should be appreciates that aspects of the present application are not so limited and that any suitable implementation of a test point on a semiconductor wafer may be used, such as a portion of a metal trace, a solder bump, or a suitable conductive structure known in the art. A DUT 30 may have a large number of test points, such as at least 500, at least 1,000, or between 500 and 10,000 test points arranged on the insulative surface 32 in any suitable type of grid array. Alternatively, a DUT may have a small number of test points, in which case connections may be made to multiple DUTs on the same wafer for simultaneous testing of multiple DUTs. In either case, there may be an array of test pads to which connections are made. For simplicity of discussion, a single DUT will multiple test points will be used as an example, but it should be appreciated that other configurations are possible. Examples of grid arrays include a concentric array, a hexagonal close packed array, an orthogonal array, or a mixture thereof. Each test point may also have any suitable shape, such as but not limited to rectangular, circular, oval. The test point array has a centroid 112 that corresponds to a geometrical center of the array of wafer pads 110 when viewed from a vertical direction (V) normal to the insulative surface 32.

Probe pins 410 may be of a vertical-type probe pin design, where each probe pin is oriented in use substantially vertically with the wafer to be probed. Each probe pin 410 may be formed from metal wire or plated micro-electromechanical systems (MEMS) having any suitable cross-sectional shape. While FIG. 2 illustrates that the probe pin is straight, it should be appreciated that each probe pin 410 may have a slight curvature in at least a section of the probe pin that forms a compliant spring when the probe pin is compressed between the probe card pad 310 and a wafer pad 110 on the DUT. In some embodiments, the slightly curved probe pin may be referred to as a Cobra pin, although other probe pin configurations known in the field may be suitable.

Guide plate 400 has a plurality of guide holes in which individual probe pins 410 are fitted. The guide holes are arranged in an array that aligns with the specific wafer pad array 110 on the DUT, such that the probe needles 410b of probe pins 410 can land on and make electrical contact with each corresponding wafer pads 110 during testing. In some embodiments, guide plate 400 may be considered an interposer that sits between second circuit board 300 and the DUT 30, and serves to interface routing between probe card pads 310 and wafer pads 110 on the DUT 30 by a plurality of probe pins 410. Interposer 400 may comprise a semiconductor substrate that includes an insulative material, such as a dielectric material. It should be appreciated that guide plate 400 is depicted in FIG. 2 as a unitary member for the simplicity of illustration only, and aspects of the present application may also apply to a guide plate that comprises multiple components. For example, the guide plate 400 may comprise two or more plates stacked along the vertical direction, each plate in parallel to the surface 32 of DUT 30.

During manufacturing of probe card assembly 100, guide plates 400 may be mechanically fastened to the second circuit board 300 via one or more mechanical fasteners (not shown) such that the array of probe card pads 310 and array of probe pins 410 are in contact.

Probe card pads 310 are formed of one or more layers of conductive material such as metal, and are arranged in an array that generally aligns to the array of probe pins 410 and the wafer pads 110, such that each top end 410a contacts a corresponding probe card pad 310, when a center of the pads 312 is aligned with the center 412 of the probe pin array. The center 312 of the pad array 310 may be computed as a centroid 312 of the pads in the array. Each probe card pad 310 may be of any suitable shape and spatial arrangement known in the art.

The second circuit board 300 may comprise a dielectric body, with a an array of pads 310 disposed on a surface 320 of the dielectric body that is facing the DUT. Second circuit board 300 may be a printed circuit board (PCB) or a printed wire board. In some embodiments, second circuit board 300 may be formed of multiple layers of organic materials, such as a polymer, and may be referred to as a multi-layer organic (MLO) board.

Some of the probe card pads are configured to carry test signals to corresponding test points on a wafer and may be referred to as "signal pads," while some other probe card pads are configured to provide a reference voltage such as ground or power to the wafer, and may be referred to as "ground pads" or "power pads," respectively. In some embodiments, the test signals, power and ground voltages are provided to signal pads, ground pads and power pads via interconnection structures within the second circuit board 300. The interconnection structures couple respective probe card pads to the rest of the test system via for example solder bumps 210 and the first circuit board 200.

FIG. 2 illustrates vias 302 and planes 304 that can be part of interconnection structures embedded within second circuit board 300. In the example shown in FIG. 2, vias 302 are conductive structures that extend vertically to interconnect a probe card 310 on the bottom surface 320 of board 300 to another conductive structure disposed in a different plane parallel to but offset vertically from surface 320, such as plane 304. Planes 304 are conductive structures that extend transversely within board 300 in a direction parallel to the surface 320, and can be a power plane, a signal trace, or a ground plane. It should be appreciated that while only one plane 304 is shown in FIG. 2 for simplicity, embodiments of the present application is not so limited and a plurality of planes 304 may be provided within board 300 and disposed in more than one transverse planes to interconnect components laterally within the board 300. There is also no limit as to the lateral dimension of planes 304 and in some embodiments, a plane 304 may be implemented as a trace having an elongated shape with a length that is much greater than a width. In particular, 304 may be a trace when used to carry a test signal. Similarly, a plurality of vias 302 may be provided to interconnect a trace with one or more probe card pads 310 on surface 320, or to interconnect a trace with solder bumps 210 in between boards 200 and 300.

Some of the vias are configured to carry test signals to corresponding test points on a wafer and may be referred to as "signal vias," while some other vias are configured to provide a reference voltage such as ground or power to the wafer, and may be referred to as "ground vias" or "power vias," respectively.

The test signals carried on signal pads may be signals generated within the wafer and measured from test points on the wafer, or externally generated stimulus signals provided to test points on the wafer. In some embodiments, the test signals may be a radio frequency signal having a frequency of at least 10 MHz, at least 100 MHz, at least 1 GHz, at least 10 GHz, between 1 GHz and 100 GHz, between 10 GHz and 60 GHz, or of any other frequency range suitable for semiconductor devices to be tested under a probe card assembly.

The power pads may supply external power from the tester to components on the wafer. The supplied power may be direct current (DC) power, as well as alternative current (AC) power. In some embodiments, AC power may be provided to components on the wafer at a frequency of at least 10 MHz, at least 100 MHz, at least 1 GHz, at least 10 GHz, between 10 MHz and 10 GHz, between 50 MHz and 5 GHz, or of any other frequency range suitable for semiconductor devices to be tested under a probe card assembly. Probe pins that are in contact with power pads on the board 300 may carry higher amounts of DC or AC currents than probe pins for signal pads. Some of the supplied DC or AC currents may flow through a conductive path from a power pad on the probe card circuit board, to a probe pin connected to the power pad, to a corresponding wafer pad on the wafer under test, to components within the wafer under test, and return to one or more grounds pads on the probe card circuit board via corresponding probe pins and wafer pads.

In some embodiments, circuit boards within a probe card can have additional components that can process or condition signals on the probe card pads. The additional components may be passive or active components, such as but not limited to discrete resistors, capacitors, inductors, or any suitable combination thereof. In the example illustrated in FIG. 2, bypass capacitor or decoupling capacitors 306 are disposed on surface 320 of the second circuit board 300, for example by surface-mounting. Bypass capacitors 306 are connected to power pads 310 via traces 304 and in some embodiments, circuit boards within a probe card can have additional components that can process or condition signals on the probe card pads. The additional components may be passive components, such as but not limited to discrete resistors, capacitor, inductor, or a capacitor chip. In the example illustrated in FIG. 2, bypass capacitors or decoupling capacitors 306 are disposed on surface 320 of the second circuit board 300, for example by surface-mounting. By pass capacitors 306 are connected to power pads 310 via planes 304 and vias 302 to filter out non-DC components in a DC power supply voltage. Depending on the application, various other types of additional components may be provided, including active circuitry such as a semiconductor chip. Any suitable packaging techniques known in the art may be used to provide the additional components on circuit boards within a probe card, such as but not limited to mounting on an exterior surface, or embedded within the interior of one or more circuit boards.

High frequency transient power is supplied either from the tester, bypass capacitors, or from components on the wafer under test itself. In some embodiments, the wafer may be tested in a loop back configuration, where high frequency digital, analog or power signals are transmitted form a current path that originates from components at a first region on the wafer under test, upwards via a wafer pad and corresponding probe pin to a first probe card pad, routed via one or more traces, planes and vias within a circuit board in the probe card to a second probe card pad, and then to components at a second region on the wafer under test via its corresponding wafer pad and a probe pin connected to the second probe card pad.

Regardless of how signals and power are assigned to the array of probe card pads in the probe card assembly, the inventor has recognized that when high frequency test signals and high frequency transient power signals are routed using the vias and planes 304 to the DUT, high impedance from the high inductive coupling between adjacent vias may undesirable lead to impedance mismatch and signal loss at the wafer. To solve this problem, aspects of the present application are directed to providing an arrangement of vias within the probe card circuit board that places vias in close proximity to each other. Furthermore, the vias may be arranged in some embodiments such that power and/or ground vias surround a signal via to provide a radio frequency shielding to the signal via and reduce crosstalk between signal vias.

Figure 3A:
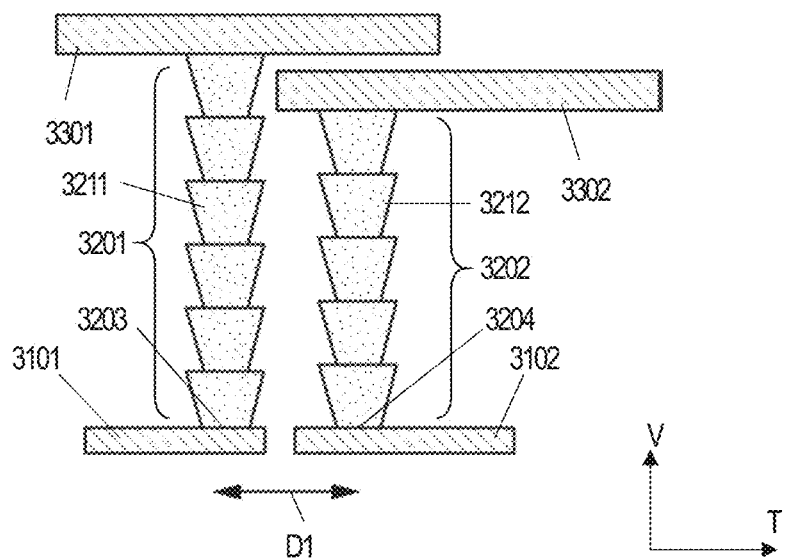
FIG. 3A illustrates a side view diagram of transposed vias connecting different planes within an exemplary circuit board, in accordance with an embodiment.

FIG. 3A illustrates a side view diagram of transposed vias connecting different planes within an exemplary circuit board, in accordance with an embodiment. FIG. 3A shows two vias 3201, 3202 disposed side-by-side transversely. The vias 3201, 3202 are disposed within a board such as MLO 300 as shown in FIG. 2, and each elongated vertically perpendicular to a surface of the board such as surface 320. A contact surface 3203 of via 3201 is in contact with a first pad 3101, while the top of via 3201 is in contact with a first plane 3301. A contact surface 3204 of via 3202 is in contact with a second pad 3102, while the top of via 3201 is in contact with a first plane 3301.

First pad 3101 and second pad 3102 may be disposed on the same plane parallel to the surface 320 of the board, and are formed of a suitable metal conductive material known in the art. In some embodiments, pads 3101, 3102 may be wafer card pads similar to wafer card pad 310 disposed on surface 320 of the board 300 as shown in FIG. 2, and are shaped and positioned to align with probe pins 410 and corresponding wafer pads 110 on the DUT. However, it should be appreciated that it is not a requirement that pads 3101, 3102 are pads on the exterior surface of the board. In some embodiments, pads 3101, 3102 may be disposed in a plane within the interior of the board. Although not shown, one or more conductive structures such as vias may optionally and additionally connect the bottom surface of pads 3101, 3102 to route signals to one or more planes that sit below the two pads.

Figure 3B:
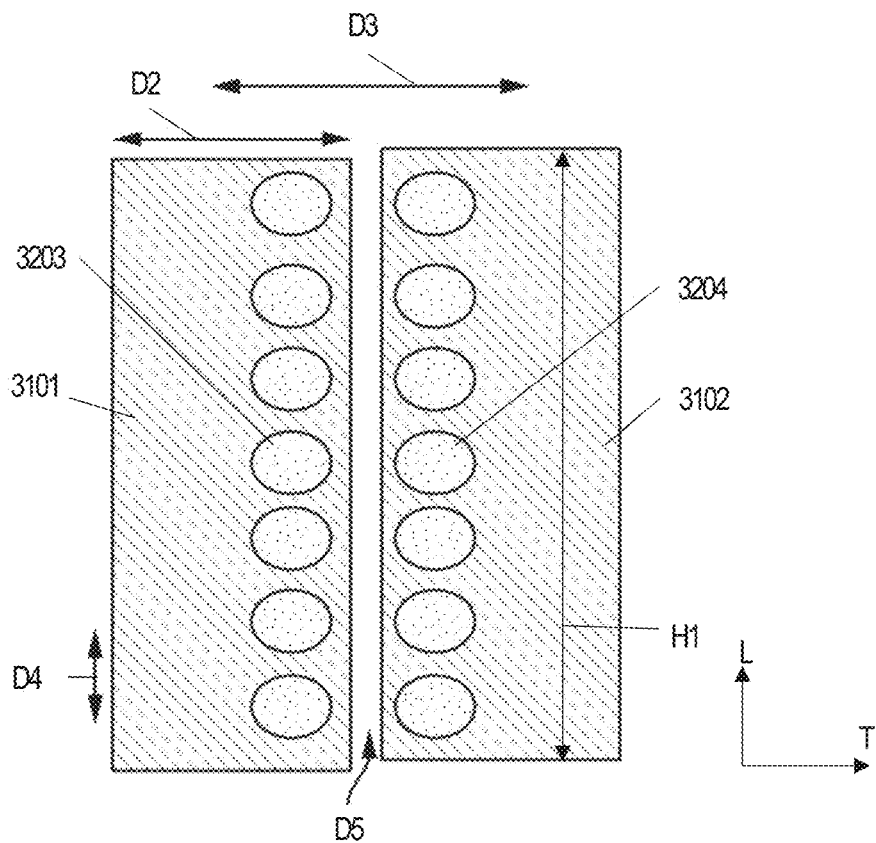
FIG. 3B illustrates a top view diagram of the structures as shown in FIG. 3A.

FIG. 3B illustrates a top view diagram of the structures as shown in FIG. 3A, and shows that pads 3101, 3102 have a rectangular shape, with a center-to-center spacing D3 and a width D2 along the transverse direction (T). Referring back to FIG. 3A, vias 3201, 3202 are transposed laterally from centers of pads 3101, 3102, and a center of contact surface 3203 and a center of contact surface 3204 are offset laterally towards each other from centers of respective pads 3101, 3102. The center-to-center spacing D1 between the two vias 3201, 3202 is therefore reduced compared to D3. The inventor has recognized and appreciated that by placing the two adjacent vias closer together, inductance between the two vias 3201, 3202 may be reduced and the impedance lowered to match that of other components within the test system and within the DUT. Furthermore, capacitive coupling between the two vias will increase, further contributing to reduction of impedance.

As shown in FIG. 3A, the top of via 3201 is in contact with a first plane 3301, while the top of via 3202 is in contact with a second plane 3302 that is offset vertically from the first plane. First plane 3301 may be a power plane, while second plane 3302 may be a ground plane. Second plane 3302 overlaps first plane 3301 in the vertical direction in a region above the top of second via 3202. Such "ganging" of the planes can ensure electrical isolation between the two planes, while providing sufficient contact areas for the two vias 3201, 3202 that are disposed very close to each other laterally. In some embodiments, one of the planes such as plane 3301 may have a portion that serves as a pad that is exposed on a top surface 322 of the board 300 that is opposite the surface 320 for connection with circuit board 200.

Each via may be an axio-symmetric structure about a vertical axis, with the contact surfaces 3203, 3204 having a circular or oval shape as illustrated in FIG. 3B. When the board is an MLO board, via 3201 may be constructed in a layer-by-layer fashion during construction of the MLO board. In some embodiments, a via hole is created in each successive layer of the MLO board material, and filled with a conductive material to form a via segment 3211. Another via hole of similar shape is created in a subsequent layer above the previously formed via segment 3211, and filled to create a vertical stack of via segments 3211 that form the via 3201.

Any suitable semiconductor manufacturing technique may be used for creation of via holes in a layer of MLO board material, such as but not limited to patterned etching, mechanical drilling, or laser drilling. Each via segment 3211, 3212 may be cylindrical or cone shaped as illustrated in FIG. 3A, and may be filled with a suitable conductive material that includes but is not limited to a metal, a metal alloy, metallic nitride, or combinations thereof.

Referring to FIG. 3B, pad 3101 may be a power pad, while pad 3102 may be a ground pad. The two pads are shaped to have a long edge with length H1 along the longitudinal (L) direction and width D2 along the transverse direction. The length H1 is provided such that an array of vias 3201 may be provided to contact pad 3101, as shown in FIG. 3B. Similarly, an array of vias 3202 may be provided to contact pad 3102 as illustrated in FIG. 3B. The inventor has recognized and appreciated that providing multiple vias that are in contact with a large pad such as contact pad 3101 have several benefits compared to using smaller, individual contact pads configured to each contact one probe pin 410 and one via. For example, the large contact pad 3101 may be shaped to capture a number of probe pins 410 at the same time, while permitting a different number of vias 3201 on the pad 3101 that are not necessarily equal to the number of probe pins 410 underneath the pad 3101. More number of vias 3201 may be provided than the number of probe pins 410 on the contact pad 3101, which would reduce the resistance and increase current-carrying capability for current passed through the power pad and ground pad. As another benefit, vias 3201 may have a different pitch than the pitch of the probe pins 410 or the pitch of wafer pads on the wafer. For example, if wafer pads on the wafer have a pitch is at 130 µm, the vias 3201 may be designed to be closer to each other and have a pitch at 60 µm, which provides approximately double the number of vias compared to the number of probe pins and wafer pads. Without wishing to be bound by a particular theory, arranging the vias closer together than the DUT wafer pad pitch reduces the electrical field lines between the vias. Moreover, an increase in the number of vias may additionally or alternatively reduce inductance by increasing the number of signal paths in parallel.

In some embodiments, the contact surfaces 3203, 3204 may be circular and have a diameter of about 40 µm. The via center-to-center spacing D1 along the transverse direction may be about 80 µm. The via center-to-center spacing D4 along the longitudinal direction may be about 60 µm. The width D2 for each pad 3101, 3102 may be about 110 µm, with the two pads having a center-to-center pitch D3 of about 130 µm, such that a gap D5 of about 20 µm is between the two pads. It should be appreciated that the dimensions as described above are by way of example only and aspects of the present application are not so limited. For example, D1 may be pushed to be as close to the gap between the two pads as possible, with the consideration that spacing between the two vias is not designed to be lower than the permissible lateral resolution and tolerance during the via manufacturing process.

It should be appreciated that while only a pair of vias a few pads and planes are illustrated, such depiction is for simplicity and illustrative purpose only and embodiments of the present application may have any number of like components in a probe card assembly.

Figure 4A:
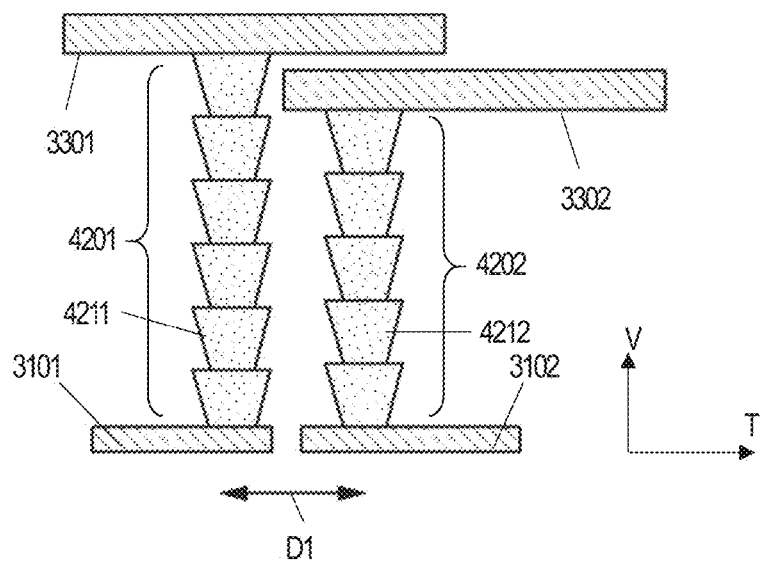
FIGS. 4A and 4B are side view and top view diagrams of a variation of the embodiment in FIGS. 3A and 3B, but with vias having a rectangular cross section.
Figure 4C:
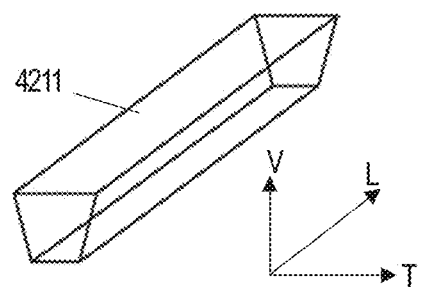
FIG. 4C is an isometric view of an exemplary rectangular via segment, according to an embodiment.
Figure 4B:
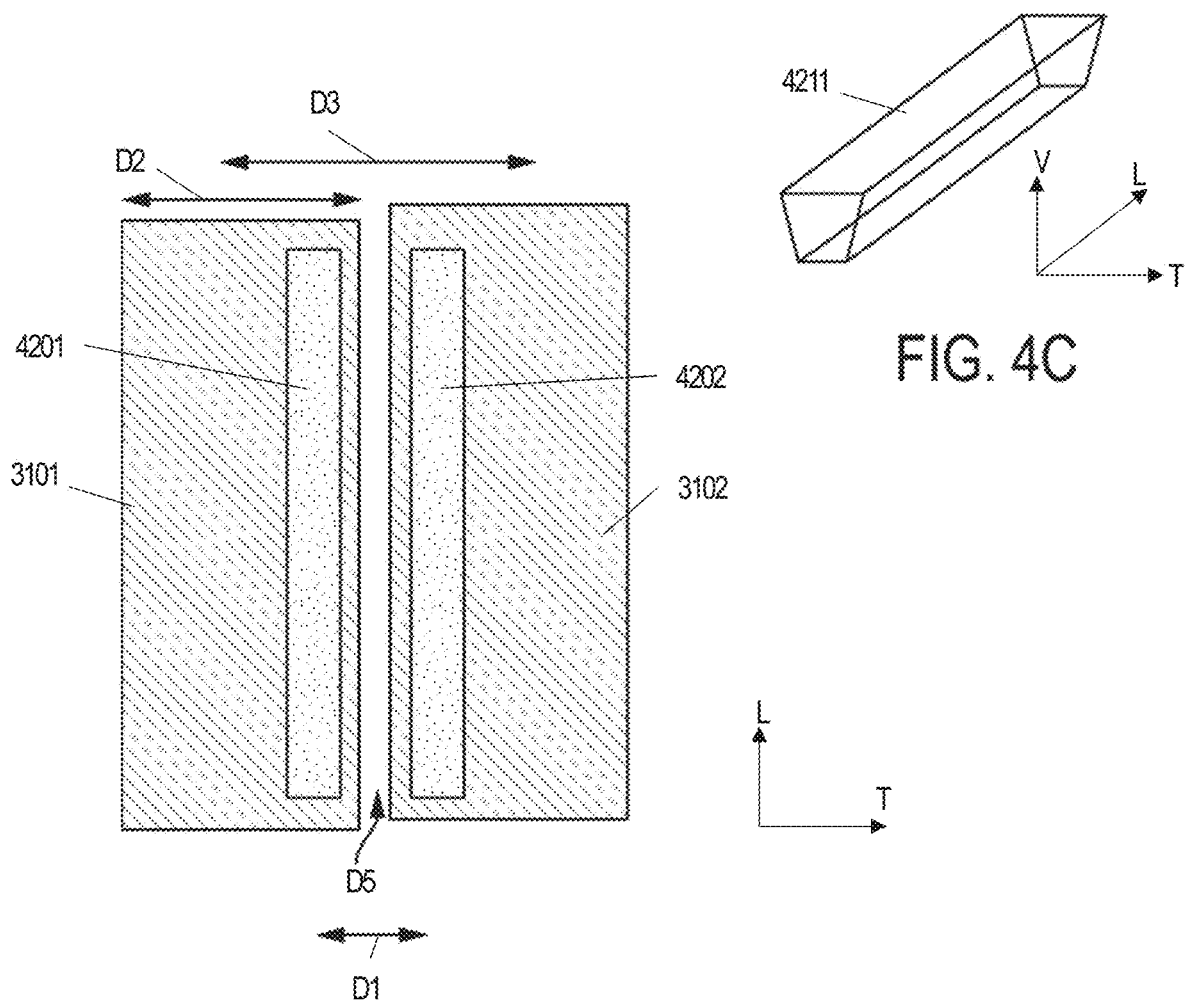

While cylindrically-shaped vias are shown in FIGS. 3A and 3B, aspects of the present application are not so limited. FIGS. 4A and 4B are side view and top view diagrams of a variation of the embodiment in FIGS. 3A and 3B, but with vias having a rectangular cross section.

FIG. 4A shows vias 4201, 4202 that connects pad 3101 with plane 3301, and pad 3102 with plane 3302, respectively. Vias 4201, 4202 have rectangular cross sections and have a length that spans nearly the entirely length longitudinally on pads 3101, 3102 as illustrated in FIG. 4B. By having a long rectangular-shaped via instead of an array of individual cylindrical vias as shown in FIG. 3B, a higher contact area between via 4201 and pad 3101 can be achieved, which lead to lower contact resistance and higher current carrying capability when the pads are power pads and ground pads. As another benefit, a rectangular shape can provide lower inductance than multiple round shapes. Without wishing to be bound to a particular theory, the inventors has recognized that electric field lines can get in between the individual circle-shaped vias, whereas in the rectangle shaped vias, the field lines can only go around the far edges. In some embodiments, the width of vias 4301, 4302 may be similar to the diameter of the cylindrical via 3201, and the center-to-center spacing D1 may be similar to that between vias 3201, 3202.

Vias 4201, 4202 may sometimes be referred to as rectangular vias. It should be appreciated that techniques for manufacturing vias 3201, 3202 may be readily modified to fabricate rectangular vias. For example, rectangular trenches may be patterned in each layer of the MLO board, prior to filling in the trench to form rectangular via segments 4211, 4212 that stack up vertically to form via 4201, 4202. FIG. 4C shows an isometric view of an exemplary rectangular via segment 4211, according to an embodiment. In the example shown, the via segment 4211 has an inverted trapezoidal cross section along a plane perpendicular to the longitudinal direction, with the bottom face being narrower than the top face, although it should be appreciated that such a cross sectional shape is but one design choice and any suitable design and manufacturing method may be used for forming rectangular vias 4201, 4202.

Figure 5A:
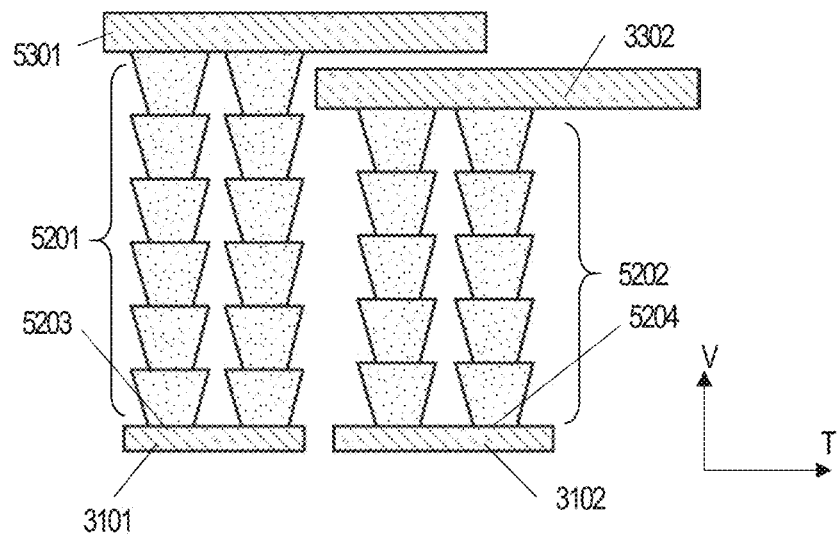
FIGS. 5A and 5B are side view and top view diagrams of another variation of the embodiment in FIGS. 3A and 3B with a staggered via array.
Figure 5B:
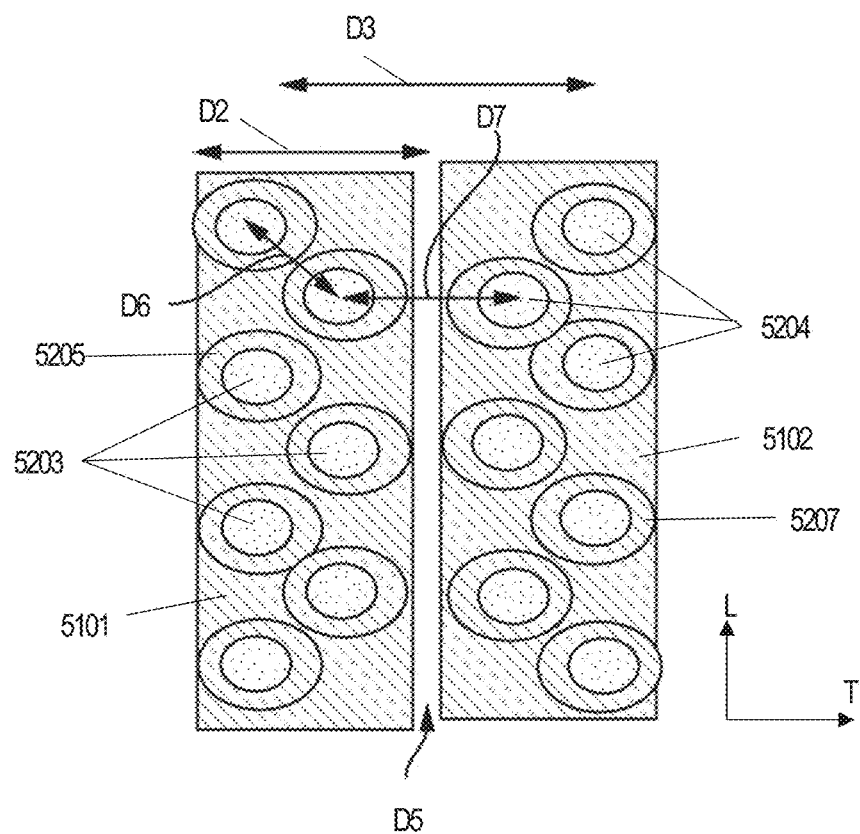

FIGS. 5A and 5B are side view and top view diagrams of another variation of the embodiment in FIGS. 3A and 3B with a staggered via array.

In FIG. 5A, via arrays 4201, 4202 each connects pad 3101 with plane 3301, and pad 3102 with plane 3302, respectively. As shown in FIG. 5B, via array 5201 is arranged in a staggered array on pad 3101, with a first longitudinal column of four vias, and a second longitudinal column of three vias. The via contact surfaces 5203, 5204 on pads 3101, 3102 are circular in the example shown, and may have the same diameter as vias 3201 as shown in FIG. 3A. Staggering the via arrays can provide a higher number of vias (7 on a pad in the example shown in FIG. 5B) compared to the example in FIG. 3B, which can enhance the current carrying capability of the vias because the current shared by each via is reduced. As another benefit, the inductance may be reduced by having more vias in the signal path, and breaking up more of the electric field lines. It should be appreciated any number of vias in the via array may be provided on a pad such as pad 3101. In some embodiments, each via may be manufactured as a multiple-layer stack of via segments, with each via segment having a reverse cone-shape geometry. FIG. 5B illustrates projections 5205, 5207 of outer rims of each cone-shaped via segment on the pads 3101, 3102.

The center-to-center spacing D6 of via array 5201 as shown in FIG. 5B may be similar to the spacing D4 between adjacent vias in FIG. 3B. As illustrated in FIG. 5B, portions of via arrays 5201, 5202 have vias having a close center-to-center distance D7, which is reduced from the pitch D3 between pads 3101 and 3102. In some embodiments, the diameter of each contact surface 5203 of a via may be about 40 μm, the via-to-via pitch D6 may be about 60 μm, while D7 may be about 80 μm.

Figure 6A:
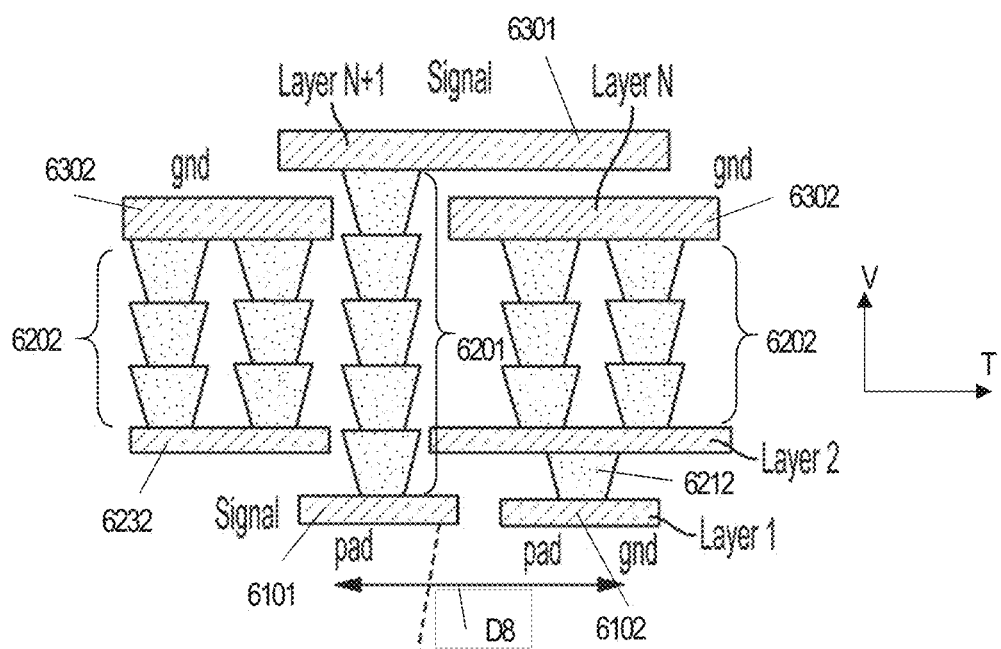
FIGS. 6A, 6B, and 6C are side view and top view diagrams, respectively, of an embodiment having a plurality of ground vias surrounding a signal via.
Figure 6B:
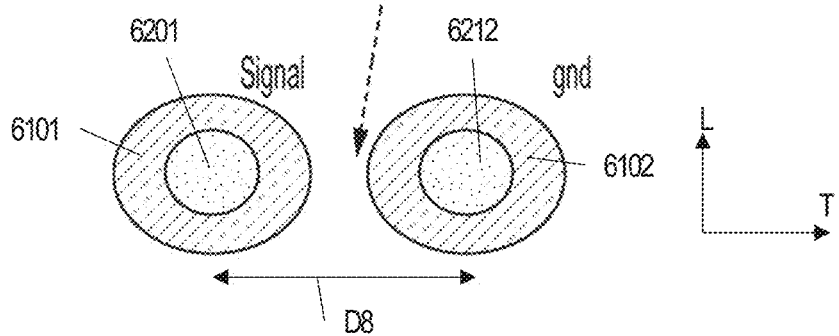

Some aspects are directed to a probe card having vias having a coaxial arrangement that provide electromagnetic shielding to a signal via to reduce crosstalk between adjacent signal vias and create controlled impedance structures. FIGS. 6A and 6B are side view and top view diagrams, respectively, of an embodiment having a plurality of ground vias surrounding a signal via.

FIG. 6A illustrates a signal via 6201 that extends vertically connecting a pad 6101 at the bottom to a signal trace 6301 on the top. Pad 6101, via 6201 and signal trace 6301 are disposed in the interior or on exterior surfaces of board 300 as shown in FIG. 2. In some embodiments, pad 6101 is a probe card pad on bottom surface 320 of board 300, similar to probe card pad 310. Conductors in signal trace 6301 may be exposed on a top surface 322 of board 300, or may be embedded in the interior of board 300.

Figure 6C:
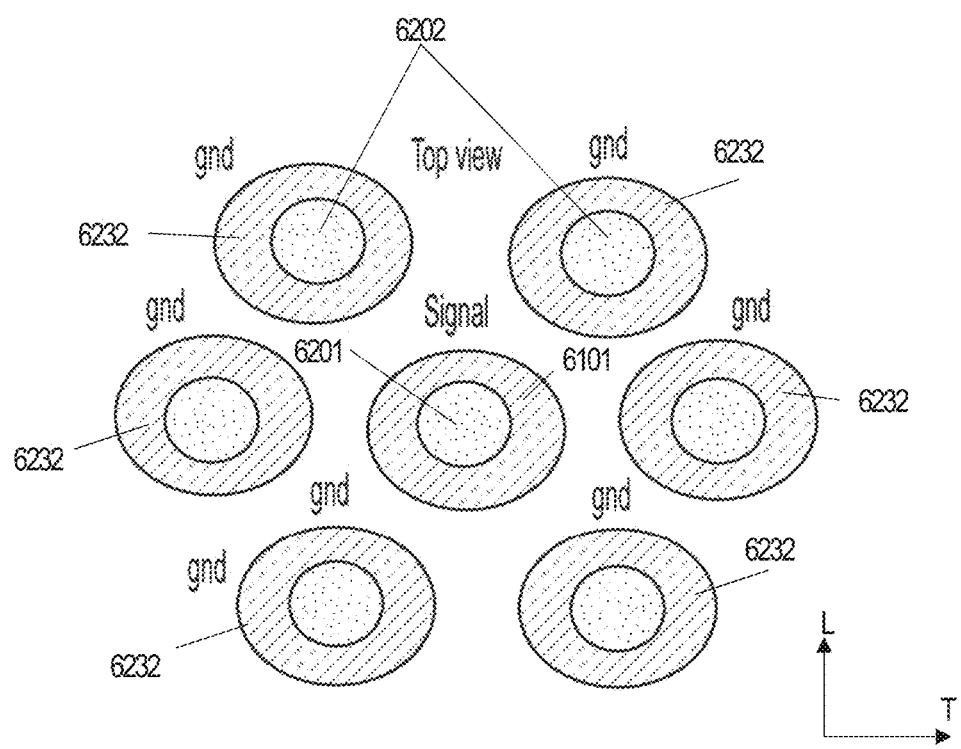

A plurality of ground vias 6202 on top of ground conductors 6232 are provided in the board 300 adjacent the signal via 6201. FIG. 6C is a top view diagram of an exemplary arrangement of ground vias and ground conductors of the type as shown in FIG. 6A, and illustrates six cylindrical ground vias 6202 on top of ground conductors 6232 that are arranged in a circle surrounding signal via 6201 and pad 6101 in the center. It should be appreciated that 6 ground vias 6202 are shown for the simplicity of illustration only and any suitable number of ground vias may be used. The ground conductors 6232 are shaped as circular pads, while other shapes may also be used. The multiple ground conductors 6232 need not be individually addressable at different voltage levels. For example, all ground conductors 6232 may be tied together in a metal plane such as layer 2 as shown in FIG. 6A. In some embodiments, ground vias 6232 may be electrically connected together via ground planes disposed in multiple layers. According to an aspect, arranging ground conductors and ground vias to at least partially surround a signal via can provide electromagnetic screening from interferences emitted from signal vias outside the circle and reduce crosstalk to the signal via 6201. Without wishing to be bound to a particular theory, the arrangement in FIG. 6C may provide similar shielding effect to providing a coaxial ground shield surrounding signal via 6101.

Still referring to FIG. 6C, while only one ground via 6202 is shown contacting one ground conductor 6232, it should be appreciated that this is not a requirement and any number of ground vias or any arrangement of via array may be provided on a ground conductor of suitable shape and dimensions. In some embodiments, it is desirable to arrange ground vias 6202 in close proximity to signal via 6101 to provide shielding. To avoid shorting between signal pad 6201 for the signal via 6101 and the ground conductors 6232, signal pad 6201 and ground conductors 6232 may be offset vertically to be at different planes.

Referring back to FIG. 6A, ground conductors 6232 are disposed in a different layer ("layer 2") that is vertically offset from the layer the signal pad 6101 is disposed in ("layer 1") to avoid shorting. A via 6212 may be provided that connects to a bottom surface of one or more ground conductors 6232 to a ground pad 6102 in layer 1.

FIG. 6B is a top view diagram of the signal pad 6101 and ground pad 6102, in accordance with some embodiments. In the example in FIG. 6B, ground pad 6102 and signal pad 6101 are probe card pads disposed on the bottom surface 320 of board 300, and are arranged to have a center-to-center spacing D8 that aligns their corresponding probe pins and wafer pads on the DUT. Therefore via 6212 serves to redistribute the ground conductors in layer 2, which do not have to conform to the shape or dimension of the probe pins and wafer pads, to the ground pad 6102. In some embodiments, D8 may be about 130 μm.

Referring back to FIG. 6A, ground via 6202 extends upward to be in contact with a ground plane 6302 that is electrically connected to a ground, or any other reference voltage within the tester. Ground plane 6302 may be disposed in a different layer ("layer N") from the layer where signal trace 6301 is disposed in ("layer N+1") to avoid shorting. While FIG. 6A depicts ground plane 6302 as layer N underneath signal trace 6301 which is disposed in layer N+1, one or more other planes in different layers may be between layer N and layer N+1. In a preferred embodiment, at least one layer between signal plane at layer 1 and signal plane at layer N is a ground plane.

Figure 7A:
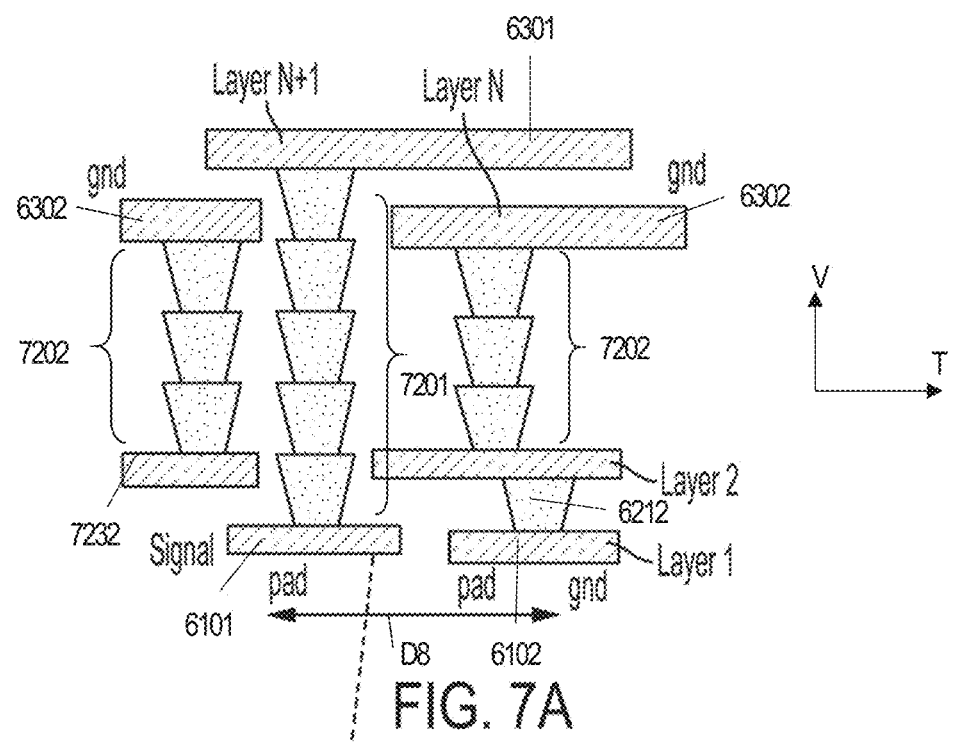
FIG. 7A is a side view diagram of another embodiment having a coaxial arrangement of vias.
Figure 7B:
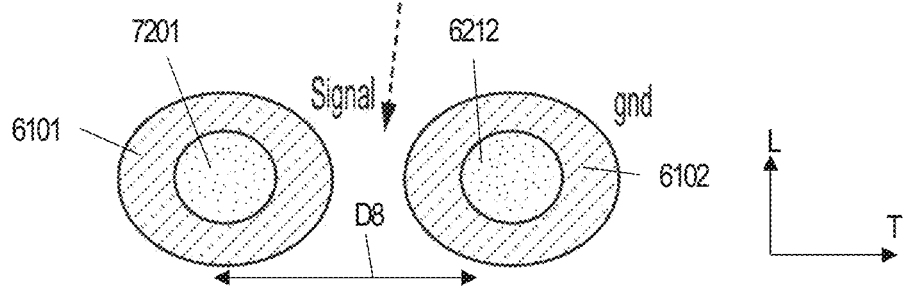
FIG. 7B is a top view diagram of the signal pad and ground pad of FIG. 7A.

FIG. 7A is a side view diagram of another embodiment having a coaxial arrangement of vias. In FIG. 7A, ground vias 7202 are arranged adjacent signal via 7201, and at least partially surrounds the signal via 7201 to provide shielding and controlled impedance. Signal via 7201 connects a signal pad 6101 of the board 300 to a signal trace 6301. The ground vias 7202 connect one or more ground conductors 7232 to ground plane 6302. A via 6212 connects and redistributes the ground conductors 7232 to a ground pad 6102 that is coplanar with signal pad 6101. FIG. 7B is a top view diagram of the signal pad 6101 and ground pad 6102.

Figures 7C, 7D:
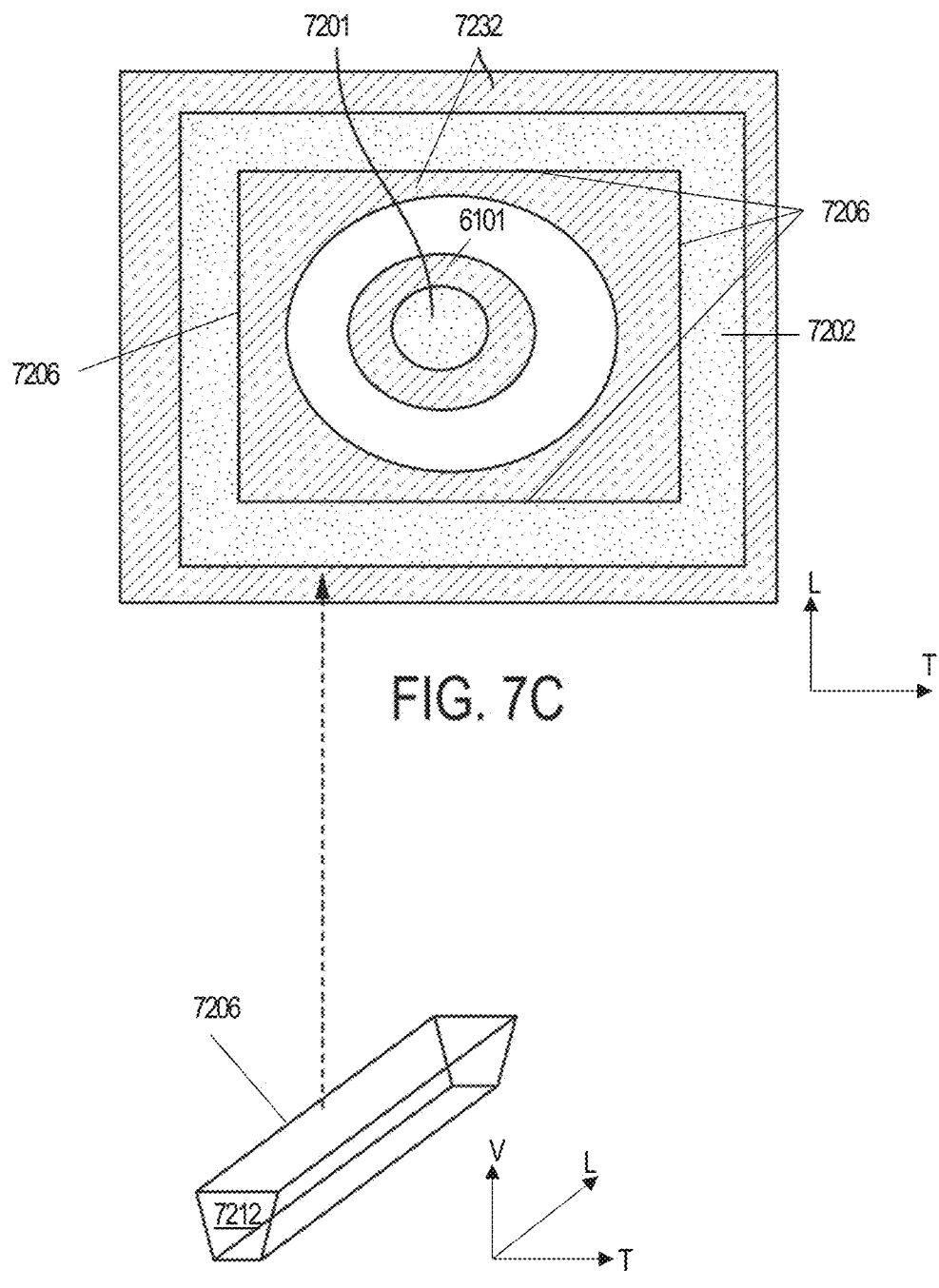
FIG. 7C is a top view diagram of the signal via, ground via, signal pad and ground conductor as shown in FIG. 7A, in accordance with some embodiments.
FIG. 7D is an isometric view of a section of ground via 7202, according to an embodiment.

FIG. 7C is a top view diagram of the signal via 7201, ground via 7202, signal pad 6101 and ground conductor 7232 as shown in FIG. 7A, in accordance with some embodiments. In FIG. 7C, ground via 7202 comprises four straight sections that join to completely enclose signal via

7201. The four straight edges of ground via 7202 along the transverse and longitudinal directions form perimeters 7206 that face the signal via 7201.

FIG. 7D is an isometric view of a section of ground via 7202, according to an embodiment. In the example shown, the ground via segment 7202 has an inverted trapezoidal cross section along a plane perpendicular to the longitudinal direction, with the bottom face being narrower than the top face, although it should be appreciated that such a cross sectional shape is but one design choice and any suitable design and manufacturing method may be used for forming ground vias.

While the ground via in the coaxial arrangement in the embodiment shown in FIG. 7C has a square profile, aspects of the present application is not so limited. FIGS. 8A and 8B are top view diagrams that show two variations of the embodiment shown in FIG. 7C.

FIG. 8A shows an embodiment where ground vias 8202 are shaped as arcs that partially enclose the signal via 7201, each ground via having a perimeter 8206 that faces the signal via 7201. While the arc angle for each ground via is about 90° as illustrated in FIG. 8A, there is no requirement that an arc has a particular arc angle and any suitable arc angles or combinations thereof may be used.

FIG. 8B shows an embodiment where a donut-shaped ground via 9202 entirely encloses signal via 7201, with a perimeter 9206 that faces signal via 7201. FIG. 8C is an isometric view of a section of ground via 9202, according to an embodiment. In the example shown, the ground via segment 9202 has an inverted trapezoidal cross section along a plane perpendicular to the longitudinal direction and extending through a vertical axis of signal via 7201. The cross-section has a bottom face that is narrower than the top face, although it should be appreciated that such a cross sectional shape is but one design choice and any suitable design and manufacturing method may be used for forming ground vias.

In some embodiments, shielding is achieved by at least partially surrounding the signal via with one or more ground vias. The ground via has a perimeter that face the signal via. For the ground via may be shaped as a rectangle, an arc, or a circle from a top view, such that an inner side of the rectangle, arc or circle faces and partially surrounds the signal via to provide electromagnetic shielding of the signal via from other conductive structures within the circuit board.

Having thus described several aspects of at least one embodiment of this invention, it is to be appreciated that various alterations, modifications, and improvements will readily occur to those skilled in the art. For example, while rectangles, arcs and circles are described in relation to FIGS. 7 and 8 as possible implementations for a ground via in the coaxial arrangement around a signal via, it should be readily appreciated that any suitable ground via shape from a top view that partially surrounds the signal via may be used to provide electromagnetic shielding of the signal via from other conductive structures within the circuit board.

Such alterations, modifications, and improvements are intended to be part of this disclosure, and are intended to be within the spirit and scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A probe card for testing a semiconductor wafer, the probe card comprising:
    a board comprising:
        a first surface, a second surface separated from the first surface in a first direction, and an interior between the first surface and the second surface;
        a plurality of pads on the first surface configured to be connected with a plurality of wafer pads on the semiconductor wafer via a plurality of probe pins contacting the plurality of pads;
        at least one layer of conductors in the interior; and
        a first via in the board, elongated in the first direction and in contact with a first pad of the plurality of pads;
        a second via in the board, elongated in the first direction, and at least partially surrounding the first via,
    wherein:
        the second via comprises a perimeter facing the first via,
        the first via is a signal via, and the second via is a ground via, and
        the second via comprises a plurality of vias connected to a common ground plane in the board.

2. The probe card of claim 1, wherein the board comprises a plurality of dielectric layers, and wherein the first via is a stack of a plurality of conductive fill material disposed within respective dielectric layers.

3. The probe card of claim 2, wherein the board is a multiple layer organic (MLO) board.

4. A probe card for testing a semiconductor wafer, the probe card comprising:
a board comprising:
a first surface, a second surface separated from the first surface in a first direction, and an interior between the first surface and the second surface;
a plurality of pads on the first surface configured to be connected with a plurality of wafer pads on the semiconductor wafer via a plurality of probe pins contacting the plurality of pads;
at least one layer of conductors in the interior; and
a first via in the board, elongated in the first direction and in contact with a first pad of the plurality of pads;
a second via in the board, elongated in the first direction, and at least partially surrounding the first via, wherein:
the second via comprises a perimeter facing the first via
the first via is a signal via, and the second via is a ground via, and
the second via comprises a plurality of trenches extending in a plane perpendicular to the first direction.

5. The probe card of claim 4, wherein the perimeter is elongated along a second direction in parallel with the first surface and is longer than an extent of the first via along the second direction.

6. The probe card of claim 5, wherein the second via has a trapezoidal shape at a cross-section along a plane perpendicular to the second direction.

7. The probe card of claim 4, wherein the perimeter is shaped as a rectangle.

8. The probe card of claim 4, wherein the perimeter is shaped as an arc.

9. The probe card of claim 4, wherein the perimeter is shaped as a circle.

10. A probe card for testing a semiconductor wafer, the probe card comprising:
a board comprising:
a first surface, a second surface separated from the first surface in a first direction, and an interior between the first surface and the second surface;
a plurality of pads on the first surface configured to be connected with a plurality of wafer pads on the semiconductor wafer via a plurality of probe pins contacting the plurality of pads;
at least one layer of conductors in the interior; and
a first via in the board, elongated in the first direction and in contact with a first pad of the plurality of pads;
a second via in the board, elongated in the first direction, and at least partially surrounding the first via, wherein:
the second via comprises a perimeter facing the first via, and
the first pad is disposed in a first plane, and the second via is in contact with a second pad disposed in a second plane different from the first plane.

11. The probe card of claim 10, wherein the second pad at least partially surrounds the first pad.

12. The probe card of claim 10, wherein the second pad comprises a circular opening that encloses the first pad.

13. The probe card of claim 10, further comprising a third via connecting the second pad to a third pad, wherein the third pad is coplanar with the first pad.

14. The probe card of claim 10, wherein second pad is a ground pad, and wherein the first pad is a signal pad.

15. The probe card of claim 10, wherein the first via is in direct contact with a conductor in a third plane, the second via is in direct contact with a conductor in a fourth plane, wherein:
the second plane and the fourth plane are between the first and third planes.

* * * * *